US005555152A

United States Patent [19]

Brauchle et al.

[11] Patent Number: 5,555,152
[45] Date of Patent: Sep. 10, 1996

[54] MONOLITHICALLY INTEGRATED MOS OUTPUT-STAGE COMPONENT HAVING AN EXCESS-TEMPERATURE PROTECTION DEVICE

[75] Inventors: Peter Brauchle, Nehren; Manfred Uebele, Reutlingen, both of Germany

[73] Assignee: Robert Bosch GmbH, Stuttgart, Germany

[21] Appl. No.: 136,627

[22] Filed: Oct. 14, 1993

[30] Foreign Application Priority Data

Oct. 28, 1992 [DE] Germany .......................... 42 36 333.0

[51] Int. Cl.$^6$ ............................................ H02H 3/00
[52] U.S. Cl. ............................................ 361/103; 361/18
[58] Field of Search ............................ 361/18, 25, 37, 361/103, 54, 56, 91, 106; 357/75; 323/265, 274, 275, 366, 369

[56] References Cited

U.S. PATENT DOCUMENTS

| | | | |
|---|---|---|---|
| 3,906,310 | 9/1975 | Esashika | 323/9 |
| 4,777,518 | 10/1988 | Mihara et al. | 361/56 |
| 4,896,245 | 1/1990 | Qualich | 361/103 |
| 5,008,736 | 4/1991 | Davies et al. | 357/75 |

FOREIGN PATENT DOCUMENTS

| | | | |
|---|---|---|---|
| 0090280 | 10/1983 | European Pat. Off. | H01L 27/02 |
| 0224274 | 6/1987 | European Pat. Off. | H01L 23/56 |
| 2106312 | 9/1971 | Germany | H01L 1/24 |

*Primary Examiner*—Jeffrey A. Gaffin
*Assistant Examiner*—Stephen Jackson
*Attorney, Agent, or Firm*—Kenyon & Kenyon

[57] ABSTRACT

A monolithically integrated MOS output-stage component, particularly a DMOS output stage, includes an output-stage element having a GATE connection, a SOURCE connection, and a DRAIN connection, and also includes an excess-temperature protection device. An integrated GATE-protection resistor is provided. The excess-temperature protection device is also integrated in the output-stage component and includes a series connection of a Zener-diode with a temperature-dependent resistor having a positive temperature coefficient. The resistor is coupled with the SOURCE connection while the Zener-diode is coupled with an outer GATE connection. The series connection is provided with a supply voltage. Furthermore, the excess-temperature protection device contains a semiconductor arrangement controlled by a control voltage at the tap node of the series connection. The semiconductor arrangement reduces the GATE voltage upon the occurrence of excess temperatures. In this way, an evaluation signal having a high total slope with respect to temperature is obtained with only slight requirements for the temperature-dependent resistor. Tank leakage currents are compensated for. The output-stage component is completely integratable in a simple manner and, thus, can be manufactured at favorable cost.

19 Claims, 3 Drawing Sheets

MONOLITHICALLY INTEGRATED MOS OUTPUT-STAGE COMPONENT HAVING AN EXCESS-TEMPERATURE PROTECTION DEVICE

BACKGROUND OF THE INVENTION

The present invention is related to a monolithically integrated MOS output stage component, and in particular, to a DMOS output stage, having ark output-stage element including a GATE connection, a SOURCE connection, and a DRAIN connection, and having an excess-temperature protection circuit.

From the development of integrated circuits, various devices for excess-temperature protection are known. These known devices utilize the flow voltage of bipolar diodes or transistors. Unfortunately, in these known protection devices, unwanted tank: leakage currents may occur. Further, these protection devices cannot operate under all operating conditions and therefore require additional electronic measures. Such additional measures make the circuit integration difficult and expensive. Thus, there exists a need for an excess temperature protection device which does not suffer from tank leakage currents and which can operate under varying conditions without requiring additional electronic measures.

SUMMARY OF THE INVENTION

The arrangement according to the present invention employs a temperature sensitive Zener-diode having a very high sensitivity. For example, the reverse current of the Zener-diode can be doubled for every 10° K. increase in temperature. This reverse current produces a voltage drop over a temperature-dependent resistor having a positive temperature coefficient. This voltage drop is compared with a reference voltage by a valuation circuit. Thus, the signal being evaluated has a high total slope. Further, the signal being evaluated remains consistent from circuit to circuit with respect to temperature even when component parameters (e.g., substrate current of the Zener-diode and temperature-dependent resistor, as well as GATE-SOURCE voltage of the following transistor of the semiconductor arrangement) vary due to different conditions present when manufacturing different lots of components.

According to the present invention, the temperature at which the current at the output stage is disconnected or controlled can be very precisely defined by adjusting a temperature-dependent resistor. When only average precision is required, such adjustments can be dispensed with.

Furthermore, tank leakage currents have no effect on the output-stage component in the present invention. The Zener-diode can detect excess temperatures under all conditions of operation and can conduct a reverse current, regardless of the DRAIN voltage of the power transistor.

To effect a "temperature disconnect", i.e., the disconnecting of the output-stage element in the event of an impermissibly high temperature, a semiconductor arrangement is provided which preferably has at least one switch element connected to the GATE connection of the output-stage element. In the event that a predeterminable temperature-dependent control voltage is exceeded, the GATE voltage can be switched to a low value, in particular to the potential of the SOURCE connection coupled with the switch element. For this purpose, the switch element is preferably developed as a flip-flop such as an RS flip-flop, for example. The switch element is preferably placed, in each case, into its initial condition in suitable manner. For example, a connect signal of the entire output-stage component may be used to initialize an RS flip-flop so that its output Q changes its state when an excess temperature occurs, thereby blocking the output stage.

A "temperature control" can also be used rather than the above-described "temperature disconnect". With a "temperature control", the GATE voltage of the output-stage element is brought closer to the SOURCE potential (i.e., lowered) as temperature increases. For this purpose, the semiconductor arrangement has at least one MOS-transistor having its DRAIN-SOURCE path connected between the GATE connection and the SOURCE connection of this output-stage element, thereby reducing the GATE voltage of the output stage element in the event of excess temperatures.

To obtain switch hysteresis upon the "temperature-disconnection" or "temperature-reduction" the temperature-dependent resistor advantageously forms at least a part of a resistance path. A node within the temperature-dependent resistor is connected via a semiconductor switch to the SOURCE connection of the output-stage element such that the semiconductor switch is brought into the blocking state when the predeterminable control voltage is exceeded.

The semiconductor arrangement preferably has a multi-stage transistor arrangement to control the MOS-transistor or the switch element based on the control voltage of the series connection. Such a multi-stage transistor arrangement functions as an amplifier and influences a desired temperature behavior.

The anode of the Zener-diode represents the base of a parasitic npn-transistor, the function of which is not desired. Therefore, to reduce the voltage rise on the anode of the Zener-diode, a voltage divider is preferably connected in parallel with it. The tap voltage of the voltage divider is then used as the control voltage to the semiconductor arrangement. The anode voltage of the Zener-diode can therefore be reduced to a desired value by the voltage divider.

Alternatively, the problem of the parasitic transistor can be solved by connecting the tap of the series connection with a comparison amplifier for comparison with a reference voltage. In this case, the increase in voltage at the anode of the Zener-diode is limited based on the evaluation of the tap voltage with the reference voltage at the comparison amplifier.

In addition, a voltage limiter for the control voltage can advantageously also be provided at the tap of the series connection. In this way the P-tank of the anode of the Zener-diode can be simultaneously used for integration of the other components for the excess-temperature protection circuit. A limiting of the tap voltage to a value of less than 300 mV is required in this case for reliable operation. Such limiting can be achieved by, for example, the voltage limiter.

The supply voltage for the series connection and the semiconductor arrangement can be either a reference voltage or the outer GATE voltage at the connection of the GATE protection resistor arranged away from the output-stage element and/or the DRAIN voltage of the output-stage element. In particular, the series connection can be acted on by the DRAIN voltage and the semiconductor arrangement by the reference voltage or the outer GATE voltage. In suitable combination with the excess-temperature protection device, a DRAIN-SOURCE voltage limiter can also be provided for the output-stage element to protect against impermissibly high voltages such as those occurring when disconnecting inductive loads.

In addition, an overload-protection device can be integrated in the output-stage component. Such an overload-protection device includes a level adaptation stage which displaces the transmission characteristic of the output-stage element by a voltage offset value defined by a current flow through the GATE protection resistor. Such an overload-protection device also includes a limiting stage which limits the value of the sum of the DRAIN-SOURCE voltage and the outer GATE-SOURCE voltage to a predeterminable value. In addition to the protection provided by the clamping against impermissibly high disconnect voltages, protection against increased power loss, for instance due to defective operating conditions, is also provided.

Several chips or output-stage components can easily be operated as modules connected in parallel, wherein the chip having the lowest clamping voltage participates in the control of the chips connected in parallel. Adjusting the clamping voltage for disparities in the component parameters resulting from different conditions present when manufacturing different component lots is not necessary since the level is adjusted such that components from different manufacturing lots have the same operational characteristics (i.e., the same operating point).

DETAILED DESCRIPTION

Figure 1:
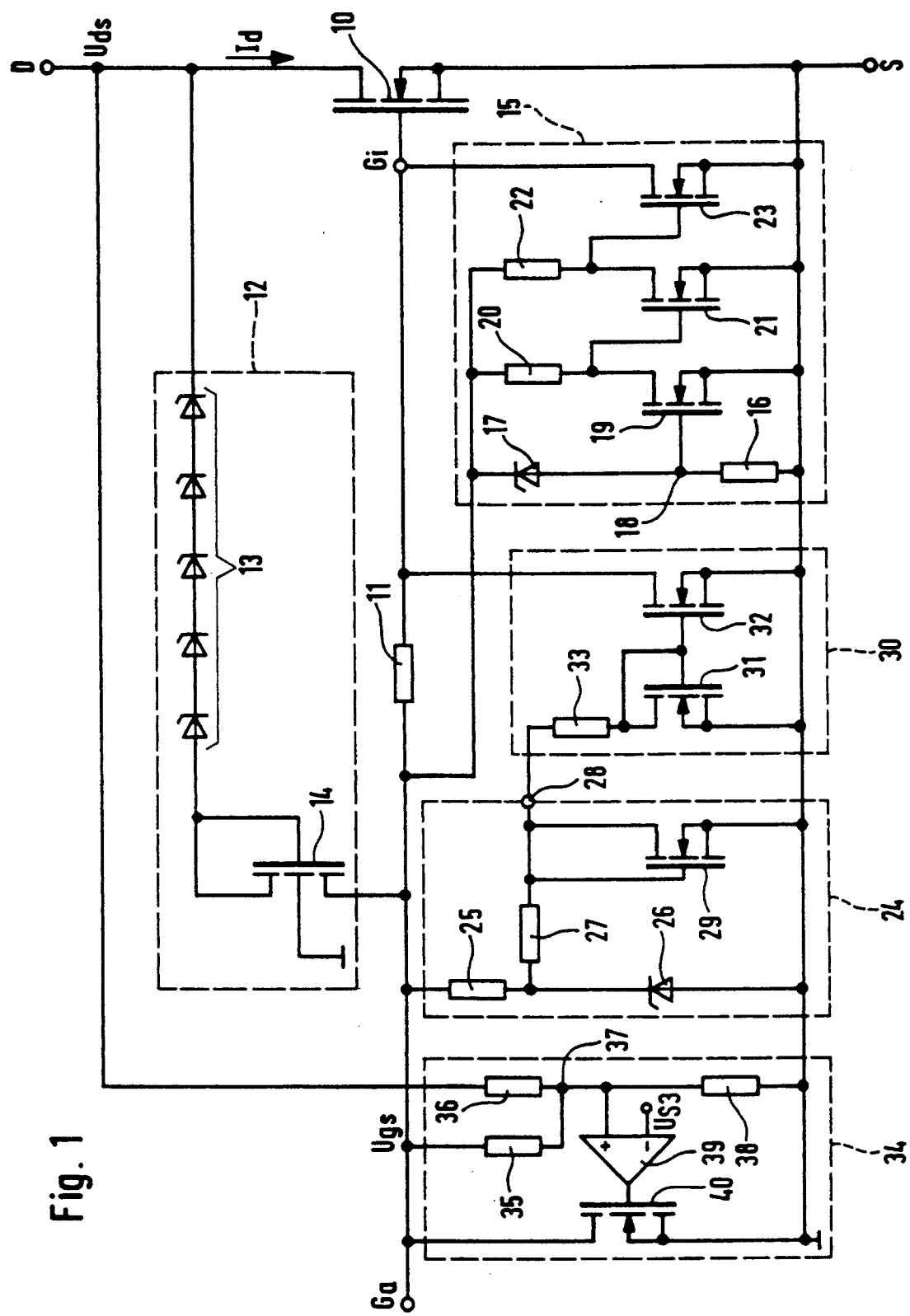
FIG. 1 is a circuit diagram of the monolithically integrated MOS output-stage component including a first embodiment of an excess-temperature protection device to reduce the output current.

FIG. 1 illustrates a monolithically integrated MOS output-stage component which is developed, for instance, as a DMOS output stage. It includes an output-stage element 10 developed as a MOS-npn-transistor serving as a controllable semiconductor element. This output-stage element 10 has, in a known manner, a DRAIN connection D, a SOURCE connection S, and a GATE connection Gi. A GATE protection resistor 11 is coupled with the GATE connection Gi, thereby defining an outer GATE connection Ga of the entire output-stage component.

A DRAIN-SOURCE voltage limiter 12 is arranged between the DRAIN connection D and the outer GATE connection Ga and provides a clamping function. This voltage limiter 12 comprises a series connection of a plurality of Zener-diodes 13 with an MOS-transistor 14 connected as a diode. The SOURCE connection of MOS-transistor 14 is coupled with the outer GATE connection Ga of the entire output-stage component, while its BULK (or GATE) connection is either grounded or connected to the SOURCE connection of the entire output-stage component. The number of Zener-diodes 13 depends on the maximum permissible voltage desired. If this voltage is exceeded, for instance as may occur when disconnecting inductive loads, further increase in the DRAIN voltage is prevented by the flow of current through the Zener-diodes 13.

An excess-temperature protection device 15 comprises a series connection of a temperature-dependent resistor 16 having a positive temperature coefficient with a Zener-diode 17. This series connection is arranged between the outer GATE connection Ga and the SOURCE connection S of the output-stage component, the resistor 16 being at the SOURCE Connection and the Z-diode 17 being at the outer GATE connection. A node 18 of this voltage divider is located between the resistor 16 and the Z-diode 17 and is coupled with the GATE connection of an MOS-transistor 19.

A resistor 20 is arranged between the outer GATE connection Ga and the DRAIN connection of the MOS-transistor 19. The SOURCE connection of the MOS-transistor 19 is coupled with the SOURCE connection S of the output-stage component. The GATE connection of another MOS-transistor 21 is coupled with the DRAIN of the MOS-transistor 19. The MOS-transistor 21 is coupled in series with a resistor 22. The GATE connection of a third MOS-transistor 23 is coupled with the DRAIN of the MOS-transistor 21. The DRAIN of MOS-transistor 23 is coupled with the inner GATE connection Gi while the SOURCE of MOS-transistor 23 is coupled with the SOURCE S of the output-stage component.

In the embodiment illustrated in FIG. 1, the excess-temperature protection device 15 is coupled with the outer GATE connection Ga for its supply voltage. Alternatively, a reference voltage source which is developed, for instance, in accordance with the reference voltage source 24 shown in FIG. 1 can also be used as a voltage supply.

The Zener-diode 17 is a temperature-sensitive element which has a very high sensitivity. For example, its reverse current may double for every 10° K. increase in temperature. At the same time, upon an increase in temperature, the resistance of the temperature-dependent resistor 16 increases so that, upon an increase in temperature, the current through this series connection, and thus the voltage at the node 18, each rises steeply (i.e., the voltage-temperature characteristic has a steep slope).

The MOS-transistor 19 also represents a temperature-dependent component which, upon an increase in temperature, responds at lower voltages. With the arrangement of these components, a high overall slope for the signal to be evaluated. Further, a slight temperature flatness is obtained as a whole even when the component parameters vary due to components used from different manufactured lots. The desired temperature switch point, i.e., the point at which the temperature control is initiated, can be set by adjusting the resistor 16 or by suitable selection of its resistance. In cases where high precision is not required, an exact adjustment can also be dispensed with.

Upon an increase in chip temperature, the control voltage at the node 18 thus increases, which results in an increased current through the MOS-transistor 19, corresponding to reduced current through the MOS-transistor 21 and accordingly increased current through the MOS-transistor 23. Thus, with increasing chip temperature, the GATE voltage at the inner GATE connection Gi is reduced to thermal equilibrium, i.e. adjusted downwards.

In the reference voltage source 24, a resistor 25 and a Zener-diode 26 are connected in series. The resistor 25 is coupled with the outer GATE connection Ga while the Z-diode 26 is coupled with the SOURCE connection S. An output 28 of the reference voltage source 24 is connected at a node between resistor 25 and Zener-diode 26 via a resistor 27. A MOS-transistor 29 is arranged between the output 28 and SOURCE connection S of the output-stage element 10.

The GATE and DRAIN connections of the MOS-transistor 29 lie at the output 28 while the SOURCE connection of the MOS-transistor 29 is coupled with the SOURCE connection S of the output-stage element 10.

In operation, voltage is present at the cathode of the Zener-diode 26. Upon an increase in voltage, the MOS-transistor 29 is driven more strongly, so that the output voltage at node 28 of the reference voltage source 24 is adjusted to a constant value.

A level adaptation stage 30, developed as a "current mirror" includes two MOS-transistors 31, 32 arranged in a "current-mirror" circuit; i.e., the two GATE connections are coupled with each other and the two SOURCE connections are coupled with the SOURCE connection S of the output-stage component. The DRAIN connection of the MOS-transistor 31 is coupled with the two GATE connections and, via a resistor 33, with the output 28 of the reference voltage source 24. The DRAIN connection of the MOS-transistor 32 is coupled with the inner GATE connection Gi of the output-stage element 10.

As a result of the fixed reference voltage at the output 28, a constant current flows through the left branch of the level adaptation stage 30 and therefore through the MOS-transistor 31. As a result of the current mirror, a constant current also flows through the MOS-transistor 32. In this way, a well-defined current flow through the GATE protection resistor 11 is obtained. The level adjustment formed thereby shifts the transmission characteristic of the output stage by a defined voltage offset value and counteracts the external threshold voltage of the output stage. In other words, no output current below this value flows to the output-stage element 10.

At the same time, a fixed association of the DRAIN current Id with the external GATE-SOURCE voltage Ugs at the external GATE connection Ga is produced, the voltage being established via a balancing. The input voltage Ugs can now be used as measurement variable for the output current Id flowing in the output-stage component. In this connection, the level adaptation is selected such that the control characteristic $$Id = f(Ugs)$$

has a negative temperature coefficient and limits the output current, stabilizing it upon an increase in the chip temperature. This can take place, for instance, by suitable selection of the temperature coefficient of the reference voltage at the output 28 or by suitable combination of the temperature coefficients of the resistors 33 and 11.

In a limiting stage 34, a node 37 is coupled with the voltage Ugs at the outer GATE connection Ga via resistor 35 and with the DRAIN-SOURCE voltage Uds at the DRAIN connection D of the output-stage element 10 via resistor 36. Another resistor 38 is arranged between the node 37 and the SOURCE connection S of the output-stage element 10. The summated voltages at the node 37 are provided to the non-inverting input of a comparator control amplifier 39 where the summated voltages are compared with a comparison voltage $U_{S3}$. The output of the control amplifier 39 is coupled with the GATE connection of an MOS-transistor 40. The DRAIN of the MOS-transistor 40 is coupled with the outer GATE connection Ga while the SOURCE of the MOS-transistor 40 is coupled with the SOURCE connection S of the output-stage element 10.

The power loss of the output-stage element 10 is Uds·Id. This power loss could be detected exactly with an analog multiplier. However, such a device is very expensive and scarcely feasible in integrated form. However, a result of the level adaptation stage 30, the voltage Ugs is proportional to the current Id. For the limit conditions indicated here (analog operation), the power loss P can be approximated as follows:

$$P = k_1 \cdot Uds + k_2 \cdot Ugs.$$

This addition is effected by the two resistors 35, 36 so that at the summation node 37, a voltage which depends on the power loss P is present. By means of the comparator amplifier 39, the power loss is limited to the value $U_{S3}$. That is, if the voltage at the summation node 37 (which is dependent on the power loss) exceeds the value $U_{S3}$, the MOS-transistor 20 is driven, resulting in a reduction in the voltage Ugs at the outer GATE connection Ga. In this way, power is limited and overload of the output-stage element 10 is protected against. At the limit regions, i.e. with very small values of Uds and Id, the power loss is strongly limited due to the addition of Uds and Id.

In this way, the physical limits of the output-stage component or the output-stage element 10 can be more strongly utilized. By means of the level adaptation stage 30, a sufficiently high supply voltage is available to limit the power loss to a value of zero thereby providing reliable operation. The combination of the power limitation by the limiting stage 34 and the excess-temperature control by the excess-temperature protection device 15 permits a relatively precise threshold for the power limitation, while the excess temperature control reduces the actual loss of power to such an extent that the chip temperature cannot rise above a predetermined limit. The adjustment of the level adaptation to the same control characteristic on the one hand and a negative temperature coefficient of the output current Id with constant input voltage on the other hand permit an easy parallel connection with several output-stage components or chips.

The chip having the lowest clamping voltage participates in controlling the chips connected in parallel. Adjusting the clamping voltage to compensate for variations in component parameters resulting from different manufacturing lots is not necessary since the adaptation of the level by the level adaptation stage 30 takes place such that components from different manufacturing lots have the same characteristic (i.e., the same operating point). Furthermore, the output current Id is imparted with negative temperature behavior upon constant input voltage to counteract asymmetries in the output current of different chips. By the parallel connection of several chips, the maximum output current Id can be increased. The modular construction permits a low effective heat resistance due to the distributed power loss.

Figure 2:
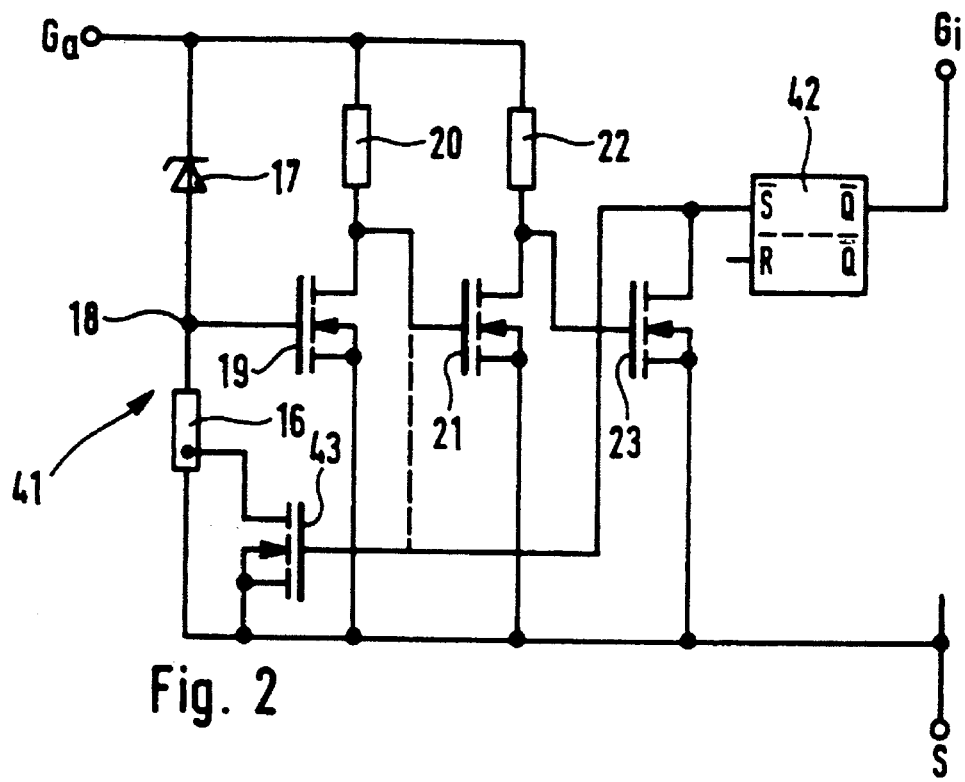
FIG. 2 is a circuit diagram of a second embodiment of an excess-temperature protection device providing a temperature disconnect with a hysteresis function.

The alternative excess-temperature protection device 41 shown in FIG. 2 can be used instead of the excess-temperature protection device 15 shown in FIG. 1. Differing from the excess-temperature protection device 15, the DRAIN connection of the MOS-transistor 23 is now connected to the setting input $\overline{S}$ of an RS flip-flop 42 the output $\overline{Q}$ of which is coupled with the inner GATE connection Gi of the output-stage element 10. Furthermore, a part of the temperature-resistant resistor 16 can be short-circuited via the DRAIN-SOURCE path of a MOS-transistor 43 the GATE connection of which is coupled with the setting input $\overline{S}$ of the flip-flop 42.

This excess-temperature protection device 41 provides an excess-temperature disconnect. If the voltage at node 18 rises above a given value, the flip-flop 42 is triggered and grounds the inner GATE connection Gi of the output-stage element 10 or brings it to the potential of the SOURCE connection S. In this way there is a sudden disconnecting of the output-stage element 10 in the event of excess temperature. The flip-flop 42 may be reset to resume the operation of the output-stage element 10 either upon the reconnecting of a supply voltage or, in time-controlled manner, after a predeterminable period of time, or else as a function of the voltage at the node 18 when the latter has dropped below a given value.

A switch hysteresis is produced by the MOS-transistor 43. With the MOS-transistor 23 initially blocked, the MOS-transistor 43 conducts, so that a part of the temperature-dependent resistor 16 is short-circuited. At a given chip temperature, the MOS-transistor 43 is driven so as to trigger a switch of the flip-flop 42. By the same triggering signal, the MOS-transistor 43 is blocked, so that now the entire resistance of the temperature-dependent resistor 16 is active and the voltage at the noble 18 thereby increases suddenly. In this way, a rapid reconnection is prevented and hysteresis is obtained. This hysteresis can, of course, also be used in an excess-temperature control in accordance with FIG. 1, (i.e., also without the flip-flop 42 being present). The MOS-transistor 43 can also be controlled by the voltage at the GATE connection of the MOS-transistor 21 as indicated by a dashed line.

Figure 3:
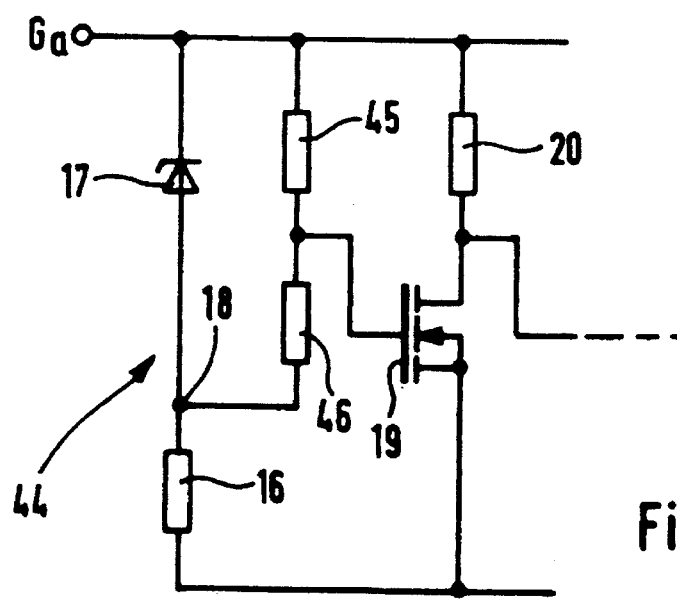
FIG. 3 is a circuit diagram of a third embodiment of an excess-temperature protection device.

The further alternative embodiment of an excess-temperature protection device 44 shown in FIG. 3 can also be used instead of the excess-temperature protection device 15. Identical or functionally identical components are provided with the same reference numerals and are not described again. The second and third MOS-transistors 21 and 23 are not shown to simplify the Figure. They can, of course, also be provided. As a modification of the previous embodiments, a voltage divider consisting of two resistors 45, 46 is now connected in parallel to the Zener-diode 17, a node between the resistors 45, 46 being coupled with the GATE connection of the MOS-transistor 19.

The anode of the Zener-diode 17 represents the base of a parasitic npn-transistor the function of which is not desired. This increase in voltage is reduced by a suitable bias voltage at the GATE connection of the MOS-transistor 19 via the voltage divider formed by the resistors 45, 46, 16, so that the response sensitivity of the transistor arrangement can be increased.

In the further embodiment of an excess-temperature protection device 47 shown in FIG. 4, once again identical or functionally identical parts have been provided with the same reference numerals and are not described again. Instead of the MOS-transistor 19 and the resistor 20, an amplifier 48, the inverting input of which is connected to the node 18 is now used. A comparison voltage $U_{S1}$ is applied to the non-inverting input of this amplifier 48. The output of this amplifier 48 controls the MOS-transistor 21 via the GATE. Furthermore, the DRAIN-SOURCE path of another MOS-transistor 49 is connected in parallel to the temperature-dependent resistor 16. The GATE of the MOS-transistor 49 is coupled with the output of amplifier 50. The non-inverting input of amplifier 50 is coupled with node 18 while a comparison voltage $U_{S2}$ is provided to the inverting input.

The voltage increase which has been described on the anode of the Zener-diode 17 is in this case limited in the following way. The signal at the node 18 is evaluated via the amplifier 48, the comparison voltage $U_{S1}$ being, for instance, 100–150 mV. Hence, the increase in voltage on the anode is limited to the value of the comparison voltage $U_{S1}$. The P-tank of the Zener-diode 17 can be used at the same time to integrate the other components for the excess-temperature protection circuit.

For reliable operation, the voltage at the node 18 must be limited to a value of less than 300 mV. This limitation is effected by the second amplifier 50 which, when the comparison voltage $U_{S2}$ of for instance 300 mV is exceeded, connects the high ohmic resistor 16 in low-ohmic manner with ground or with the SOURCE connection. In a less complex embodiment, the amplifier 50 and the MOS-transistor 49 can be dispensed with.

Figure 4:
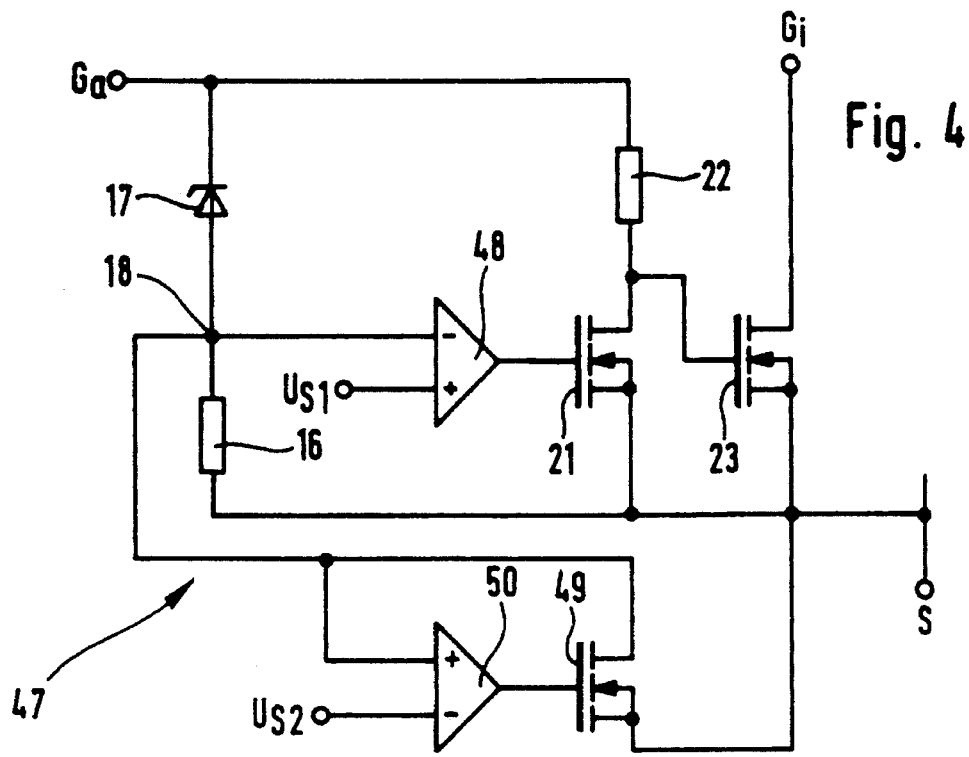
FIG. 4 is a circuit diagram of a fourth embodiment of an excess-temperature protection device.

In the embodiments shown in FIGS. 3 and 4, hysteresis in accordance with FIG. 2 can, of course, also be provided. It is also possible to use these circuit variants for excess-temperature reduction or excess-temperature disconnect.

Figure 5:
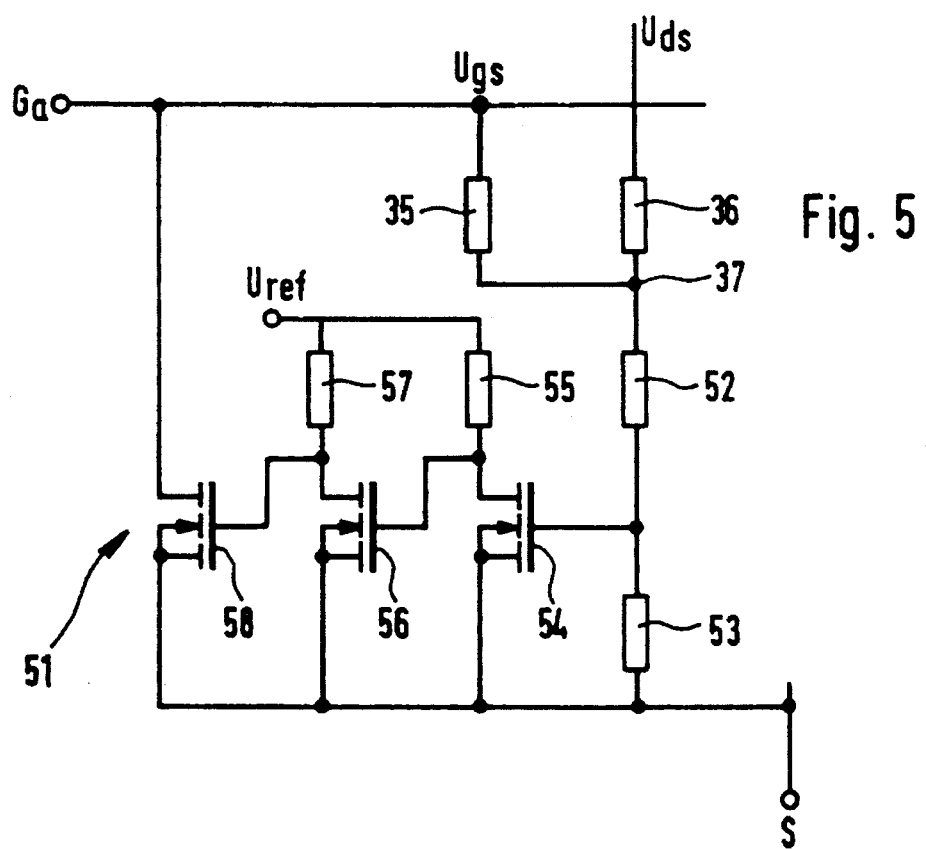
FIG. 5 is a circuit diagram of an alternative embodiment of the overload-protection device illustrated in FIG. 1.

FIG. 5 illustrates an alternative embodiment of a limiting stage 51 which can take the place of the limiting stage 34 in FIG. 1. Identical or functionally identical components have been provided with the same reference numerals and are not described again.

Here, a voltage divider having two resistors 52, 53 is arranged between the summation node 37 and the SOURCE connection S of the output-stage element 10. The node between the resistors 52, 53 controls the GATE connection of an MOS-transistor 54. The DRAIN of MOS-transistor 54 is coupled with a reference voltage source Uref via a resistor 55 while the SOURCE of MOS-transistor 54 is coupled with the SOURCE connection S. The DRAIN connection of this MOS-transistor 54 is also coupled with the GATE of a MOS-transistor 56.

As with the series connection described above, the DRAIN of the MOS 56 is coupled with reference voltage source Uref via resistor 57 while the SOURCE of MOS-transistor 56 is coupled with the SOURCE connection S. The DRAIN connection of the MOS-transistor 56 is also coupled with the GATE connection of yet another MOS-transistor 58. The DRAIN of MOS-transistor 58 is coupled with the outer GATE connection Ga while the SOURCE of MOS-transistor 58 is coupled with the SOURCE connection S of the output-stage element 10.

The signal at the summation node 37 resulting from the voltage divider consisting of the two resistors 52, 53, is proportional to the power loss and is suitable for controlling the three-stage transistor arrangement. As from a given voltage value, and therefore as from a given value of power loss, the MOS-transistor 58 is placed so far into the current-conducting state that the input voltage Ugs and thus the current Id are reduced.

The output-stage component which has been described in its different variants shown clan be completely monolithically integrated, particularly in DMOS technique.

What is claimed is:

1. A monolithically integrated MOS output-stage device having an output-stage element with a GATE, a SOURCE and a DRAIN, comprising:

a) a source connection coupled to the SOURCE of the output-stage element;

b) a drain connection coupled to the DRAIN of the output-stage element;

c) an integrated gate protection resistor provided between the GATE of the output-stage element and an outer gate connection; and d) an integrated excess-temperature protection device including:

i) a series connection of a temperature-dependent Zener-diode and a temperature-dependent resistor, the Zener diode having a reverse current which increases with increasing temperature and the temperature-dependent resistor having a resistance which increases with increasing temperature, the temperature-dependent resistor being coupled with said source connection and a cathode of the Zener-diode being coupled with said outer gate connection, and ii) a semiconductor arrangement, said semiconductor arrangement being controlled by a control voltage at a node between said Zener-diode and said temperature-dependent resistor of said series connection, wherein said semiconductor arrangement includes a switch element, said switch element including an output coupled with said GATE of said output-stage element, whereby a voltage at said GATE is switched via said switch element to a low value when a predetermined temperature-dependent control voltage is exceeded.

2. The device of claim 1 wherein said low value is equal to the potential at said SOURCE connection.

3. The device of claim 1 wherein said switch is an RS flip-flop.

4. The device of claim 1, wherein said semiconductor arrangement includes a MOS-transistor, said MOS-transistor including:
   i) a DRAIN, said DRAIN of said MOS-transistor being coupled with said GATE of said output-stage element, and
   ii) a SOURCE, said SOURCE of said MOS-transistor being coupled with said SOURCE connection.

5. The device of claim 1 wherein said temperature-dependent resistor forms at least a part of a resistance path, a tap of which is coupled via a second semiconductor switch to said SOURCE connection of the output-stage element, said second semiconductor switch being brought into a blocking state to produce a hysteresis when a predeterminable control voltage is exceeded.

6. The device of claim 1 wherein said semiconductor arrangement includes a multistage transistor arrangement, said multistage transistor arrangement controlling said MOS-transistor as a function of said control voltage provided at said node between said Zener-diode and said temperature-dependent resistor.

7. The device of claim 1 wherein said semiconductor arrangement includes a multistage transistor arrangement, said multistage transistor arrangement controlling said switch element as a function of said control voltage provided at said node between said Zener-diode and said temperature-dependent resistor.

8. The device of claim 1, further comprising a voltage divider, said voltage divider
   a) having a tap voltage, said tap voltage being provided as the control voltage to the semiconductor arrangement, and
   b) being connected in parallel to said Zener-diode.

9. The device of claim 1, further comprising a DRAIN-SOURCE voltage limiter arranged between said DRAIN connection and said outer GATE connection.

10. The device of claim 1, wherein additional output-stage components are provided by modular parallel connection.

11. The device of claim 1, further comprising a comparator, said comparator having
    a) a first input coupled with said node, and
    b) a second input provided with a reference voltage.

12. The device of claim 11, further comprising a voltage limiter, said voltage limiter limiting said control voltage and being arranged at said node.

13. The device of claim 1, wherein said outer gate connection has a voltage being one of:
    a reference voltage;
    a voltage between said outer GATE connection and said SOURCE connection; and
    a voltage between said DRAIN and said SOURCE of said output-stage element.

14. The device of claim 13 wherein said series connection is provided with the voltage between said DRAIN connection and said SOURCE connection and wherein said semiconductor arrangement is provided with one of said reference voltage and said voltage between said outer GATE connection and said SOURCE connection.

15. The device of claim 1, further comprising an overload protection device, said overload protection device being integrated in said output-stage device.

16. The device of claim 15 wherein said overload protection device includes:
   a) a level adaptation stage, said level adaptation stage producing a displacement of the transmission characteristic of said output-stage element by a voltage offset value defined by a current flowing through said GATE protection resistor; and
   b) a limiting stage, said limiting stage limits a summation value of the voltage between said DRAIN connection and said SOURCE connection and the voltage between said outer GATE connection and said SOURCE connection.

17. In a MOS output-stage component having DRAIN, SOURCE, and GATE connections, an excess-temperature protection device comprising:
   a) a gate protection resistor, said gate protection resistor arranged between an inner gate node and said GATE connection;
   b) a series connection, said series connection including a temperature-dependent Zener-diode having a reverse current which increases with increasing temperature and a temperature-dependent resistor having a resistance which increases with increasing temperature, the series connection having a tap node between said Zener-diode and said temperature-dependent resistor, a cathode of said Zener-diode being coupled with said GATE connection, and said temperature-dependent resistor being coupled with said SOURCE connection; and
   c) a semiconductor arrangement, said semiconductor arrangement being controlled by a voltage at said tap node such that in the event of excessive temperatures, a voltage at said inner gate node is reduced,
wherein said semiconductor arrangement includes:
   i) a resistor, said resistor coupled with said GATE connection; and
   ii) a MOS-transistor, said MOS-transistor
      having a DRAIN connected in series with said resistor,
      having a SOURCE coupled with said SOURCE connection, and
      having a GATE coupled with said tap node.

18. The device of claim 17 wherein said semiconductor arrangement further includes:
   iii) a voltage divider including a first resistor arranged between said GATE of said MOS-transistor and said tap node and a second resistor arranged between said GATE of said MOS-transistor and said GATE connection.

19. The device of claim 17 wherein said semiconductor arrangement further includes:
   iii) a comparator arranged between said tap node and said GATE of said MOS-transistor such that a first input of said comparator is coupled with said tap node, a second input of said comparator is provided with a reference voltage, and an output of said comparator is coupled with said GATE of said MOS-transistor.

\* \* \* \* \*

UNITED STATES PATENT AND TRADEMARK OFFICE
CERTIFICATE OF CORRECTION

PATENT No. : 5,555,152

DATED : September 10, 1996

INVENTOR(S): Peter Brauchle et al.

It is certified that error appears in the above-identified patent and that said Letters Patent is hereby corrected as shown below:

Column 1 line 10, delete "ark" and insert --an --;

Column 1, line 18, after "tank" delete ":";

Column 7, line 11, delete "noble" and insert --node--;

Column 8, line 34, delete "clan" and insert --can--.

Signed and Sealed this

Twenty-third Day of June, 1998

Attest:

Attesting Officer

BRUCE LEHMAN

*Commissioner of Patents and Trademarks*